United States Patent
Goodman et al.

[19]

[11] Patent Number: 6,011,330

[45] Date of Patent: Jan. 4, 2000

[54] MINIATURE POWER SUPPLY

[75] Inventors: Lawrence Alan Goodman, Plainsboro; Ashok Narayan Prabhu, East Windsor, both of N.J.

[73] Assignee: Sarnoff Corporation, Princeton, N.J.

[21] Appl. No.: 08/993,292

[22] Filed: Dec. 18, 1997

[51] Int. Cl.$^7$ ........................................... H02J 7/00
[52] U.S. Cl. ...................... 307/150; 361/764; 361/794
[58] Field of Search ............................ 307/150; 336/200, 336/208; 361/764, 795, 794, 761, 748; 363/147

[56] References Cited

U.S. PATENT DOCUMENTS 5,365,144  11/1994  Layh ........................................ 315/58

FOREIGN PATENT DOCUMENTS 0 743 743 A2  11/1996  European Pat. Off. .

OTHER PUBLICATIONS

International Search Report
Patent Abstracts of Japan, vol. 96, No. 3, Mar. 29, 1996 & JP, A, 07–312414 (Hitachi Ltd.) Nov. 28, 1995.

DE 4222068 C1 (ABB Patent GMBH.) Jun. 9, 1993, Claim 1, figure 1.

*Primary Examiner*—Jeffrey Gaffin
*Assistant Examiner*—Peter Zura
*Attorney, Agent, or Firm*—William J. Burke

[57] ABSTRACT

A power supply integrated module includes a metal substrate having a surface and a body of a dielectric material, such as a glass or ceramic, mounted on and bonded to the surface of the substrate. The body is formed of a plurality of layers of the dielectric material bonded together. Areas of a conductive material and a resistive material are coated on the surfaces of the layers of the body to form passive electronic components, such as capacitors, resistors and inductors. At least one transformer is on or in the body. The transformer and passive electronic components are electrically connected by conductive interconnects on the layers of the body and vias of a conductive material extending through the layers of the body to form a power supply integrated circuit. Active electronic components, such as diodes and transistors, may also be mounted on the body and electrically connected in the power supply circuit.

13 Claims, 2 Drawing Sheets

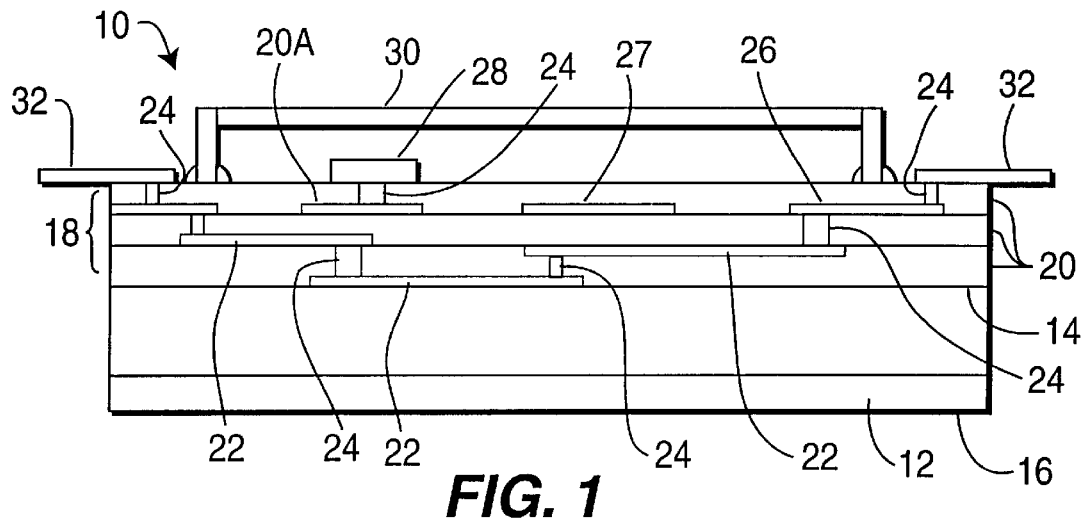
FIG. 1
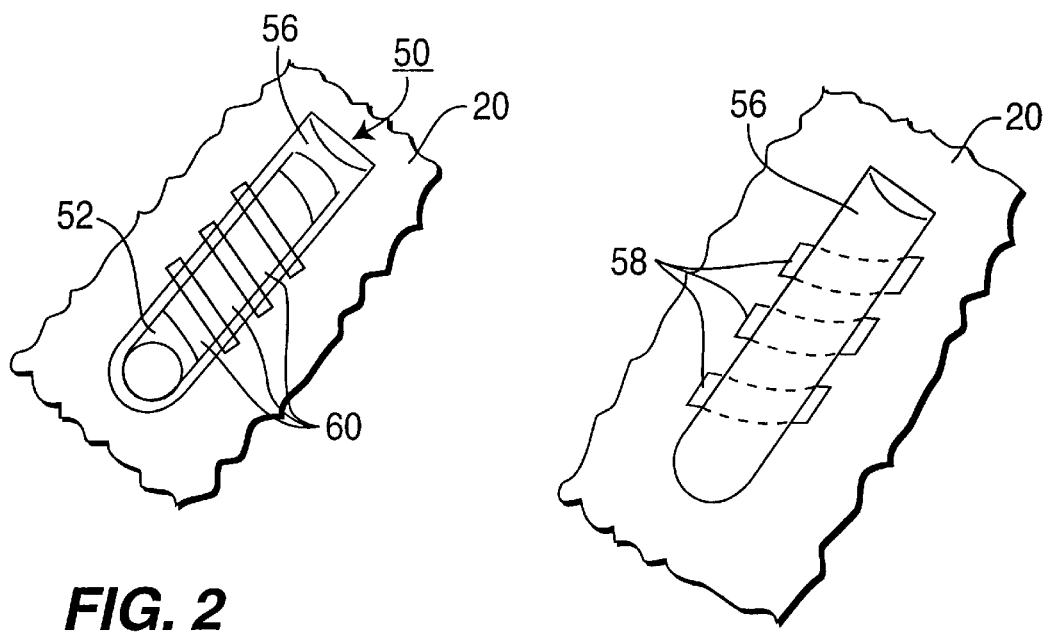
FIG. 2
FIG. 3
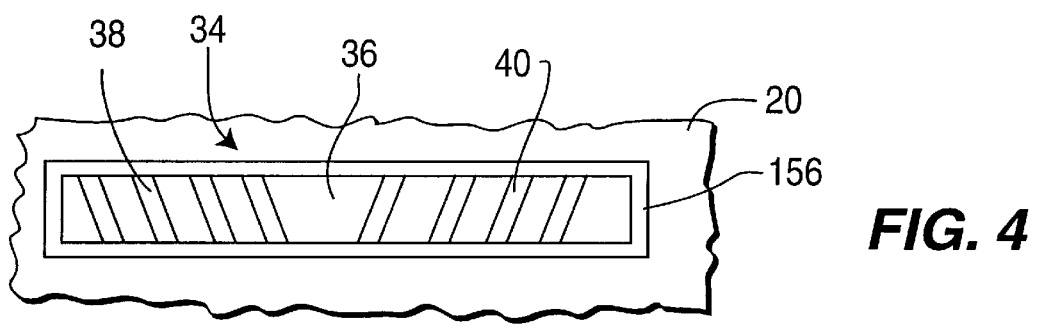
FIG. 4

MINIATURE POWER SUPPLY

FIELD OF THE INVENTION

The present invention relates to a miniature power supply, and, more particularly, to a power supply formed as an integrated electronic module so as to be relatively small in size.

BACKGROUND OF THE INVENTION

Integrated circuits (ICs) in general comprise a substrate of a semiconductor material, such as silicon, having regions therein and thereon which form various electronic passive and active components, such as diodes, transistors, capacitors and resistors. The electronic components are electrically connected to form a desired circuit. Through rapid advances in silicon technology and electronic packaging technology, the computing and signal processing capabilities per unit volume of electronic equipment have increased rapidly in the last decade. The shrinkage in component size is expected to continue at the same rapid pace for the next decade or more. However, there is potentially one major exception to this trend, namely, the much slower rate of size and weight decrease in the power supplies necessary for the operation of electronic equipment.

The size and weight of power supplies are to a significant degree determined by the reactive components, namely, the transformers, inductors and capacitors utilized in the supplies. Transformers are used to efficiently increase or decrease AC voltages, while inductors and capacitors provide passive, low-loss energy storage that is needed in the efficient conversion from one voltage level to another. To date it has not been possible to form transformers and inductors in the substrate of a standard silicon IC to satisfactorily form a power supply. Also, such silicon substrates do not satisfactorily withstand the heat that is generally developed in a power supply. Therefore, power supply circuits have not been formed in small integrated circuits using standard silicon technology.

SUMMARY OF THE INVENTION

A power supply integrated electronic module includes a substrate of a heat conducting material having a surface. A body of an insulating material is on and bonded to the surface of the substrate. The body is formed of a plurality of layers of the insulated material bonded together. Areas of electrically conductive material are on the surfaces of the layers of the body and form capacitors and resistors. A transformer is on or in the body and the transformer, capacitors and resistors along with integrated circuits, diodes and transistors are electrically connected to form a power supply circuit.

BRIEF DESCRIPTION OF THE DRAWINGS

FIG. 1 is a schematic sectional view of a power supply integrated module in accordance with the present invention;

FIG. 2 is a perspective view of an inductor which can be used in the power supply integrated electronic module of the present invention;

FIG. 3 is a view similar to FIG. 2 with the core of the inductor removed;

FIG. 4 is a top view of one form of a transformer which can be made using the inductor shown in FIGS. 2 and 3;

DETAILED DESCRIPTION

Figure 5:
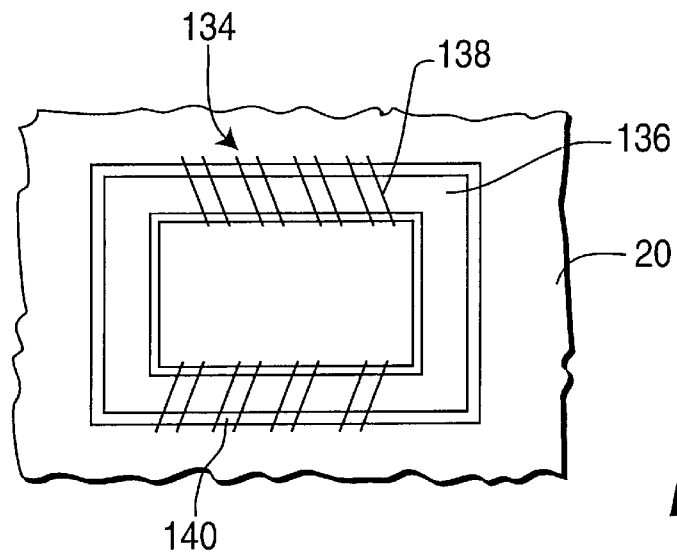
FIG. 5 is a top view of another form of a transformer which can be made using the inductor shown in FIGS. 2 and 3.

Referring initially to FIG. 1, there is shown a schematic sectional view of a power supply integrated module 10 of the present invention. The power supply integrated module 10 comprises a substrate 12 of a relatively rigid, heat conductive material, such as a metal. The substrate 12 has opposed major surfaces 14 and 16. On and bonded to the surface 14 of the substrate 12 is a body 18 of a dielectric material, such as a ceramic or glass. The body 18 is formed of a plurality of layers 20 of the dielectric material in stacked relation and bonded to each other. On the surfaces of the various layers 20 of the body 18 are areas 22 of a conductive material. The conductive areas 22 help to form capacitors, inductors and interconnects.

In an alternative embodiment, dielectric layers 20 have different dielectric constants. Preferably, for example, the middle dielectric layer 20 shown in FIG. 1 has a dielectric constant higher than the layers above and below it. In a different albeit related embodiment, a high dielectric layer constant material 20A optionally can be screened onto a localized area of conductive material 22 and reside within, for example, middle dielectric layer 20. This technique minimizes the area needed to produce capacitors, the construction of which is described below.

Capacitors can be formed by two areas 22 on the same surface of a layer 20 in slightly spaced relation, or by areas 22 on opposite surfaces of a layer 20 with the dielectric layer 20 forming the dielectric of the capacitor. Inductors can be formed by conductive areas extending in a desired path on the surface of a layer 20 or by closed loops surrounding portions of one or more layers 20. Interconnects are formed by strips of the conductive material extending between the capacitors and inductors to connect them in a desired circuit. Also on the surface of some of the layers 20 are areas 26 of a material having a desired resistivity to form resistors. Vias 24 of a conductive material extend through the various layers 20 and electrically connect the interconnects, capacitors, inductors and resistors in a desired circuit. At least one transformer 27 is formed on and/or in at least one of the layers 20 of the body 18 and electrically connected to the other electronic components. If desired, various types of discrete electronic components 28, such as capacitor, diodes, standard silicon ICs and the like, may be mounted on the top surface of the body 18 or in openings formed in the body 18, and electrically connected to the other components in the body by some of the vias 24 and interconnect material. A cover 30 may extend over and is bonded to the top surface of the body 18 so as to enclose the various electronic components in and on the body 18. Leads 32 are mounted on the top surface of the body 18 and project outwardly therefrom. The leads 32 are electrically connected to the circuit formed in the body by some of the vias 24 and interconnect material. The various electronic components in or on the body 18 and the transformer 27 are electrically connected to form a power supply circuit.

The body 18 may be formed by first mixing particles of a dielectric material, such as a glass or ceramic, in a vehicle, such as a plastic. The mixture is spread out on a surface to form a layer of a desired size, shape and thickness. The layers are dried to form a green tape of the dielectric material. Openings and via holes are then formed in the green tapes, and a conductive material may be filled in the via holes. The various conductive areas and patterns are then coated on the surfaces of the layers of green tape. The layers of green tape having the conductive areas and patterns thereon are stacked to form the body 18 and the body 18 is placed on a substrate 12. The stack of green tapes and the substrate are then fired to melt or sinter the particles of the dielectric material and bond the particles together and to the substrate. When cooled, this forms the solid body 18 on the substrate 12. If desired, the via holes may be filled with the conductive material after the body 18 is completely formed.

The integrated module 10 of FIG. 1 is shown having body 18 and its parts such as conductive areas 22 and vias 24 on a single side 14 of substrate 12. However, in another embodiment, body 10 and its parts also can extend from side 16 of substrate 12, such that integrated module 10 is two sided. Various conductive areas 22 on opposite sides of substrate 12 can be connected through vias 24. Various configurations are possible to suit the need of any design. For example, module 10 can be constructed such that all resistors 26 are on one side of substrate 12, such as side 16, and all capacitors on the other side, such as side 14.

Referring to FIG. 2 there is shown an inductor 50 which can be used in the integrated module 10 of the present invention. Inductor 50 comprises an elongated core 52 of a magnetic material, such as a ferrite, having a conductor extending spirally therearound and therealong. The inductor 50 is formed in an elongated recess 56 in at least one of the layers 20 of the body 18. As shown in FIG. 3, a set of spaced, parallel strips 58 of a conductive material, such as a metal, are coated on the surface of the recess 56 and preferably are coated with or reside within a layer of insulating material such as dielectric 20. The strips 58 extend at an angle to the longitudinal axis of the recess 56 and onto the surface of the layer 20 adjacent the recess 56. The core 52 is then formed in the recess 56 and over the strips 58. The core 52 may be a body of the magnetic material which is placed in the recess 56 or may be a thick layer of the magnetic material which is coated over the surface of the recess 56 and over the strips 58. A second set of spaced, parallel strips 60 extend over the core 52. The second strips 60 are spaced along the core 52 and are at an angle with respect to the core 52, and at an angle of substantially 0° with respect to the first strips 58. Strips 60 preferably are coated with an insulating material or reside with dielectric layer 20 so that they are electrically insulated from core 52. Each strip 60 has its ends connected to a separate one of the first strips 58 through vias so that the strips 58 and 60 form the conductor which extends spirally around and along the core 52. The ends of the conductor are electrically connected to interconnects so as to be electrically connected to other electronic components to form the power supply circuit. The inductor 50 is preferably formed in the topmost layer(s) 20 of the body 18 so that it can be easily formed.

Referring to FIG. 4, there is shown one type of transformer 34 which can be formed from the inductor 50 shown in FIGS. 2 and 3. The transformer 34 comprises an elongated core 36 of a magnetic material, similar to the core 52 of the inductor 50. Core 36 resides within a recess 156 in a layer of dielectric 20. Along the core 36 are two sets of spaced conductors 38 and 40. Each of the conductors 38 and 40 is similar to the conductor of the inductor 50. Each of the conductors 38 and 40 is made of conductive strips which extend around the core 36, preferably through dielectric 20 so as to be insulated from core 36. Conductors 38 and 40 extend in a spiral path around the core 36. Thus, the transformer 34 has two spaced coils that extend in a spiral path around a core of a magnetic material. In an alternate embodiment, core 36 could be coated with an insulating material and the conductors 38 and 40 could reside within recess 156. In such an embodiment, there would be no need to coat either of conductors 38 or 40 with an insulating material or have them run through dielectric layer 20.

Referring to FIG. 5, there is shown another type of transformer 134 which can be formed from the inductor 50 shown in FIGS. 2 and 3. The transformer 134 comprises a core 136 of a magnetic material which is either on a surface of a layer 20 of the body 18 or is formed within a recess in one or more of the layers 20. The core 136 extends in a closed path, such as a rectangle. Two conductors 138 and 140 extend around the core 136 with each conductor extending in a spiral path around a separate leg of the core 136. Conductors 138 and 140 preferably are insulated by dielectric 20 from core 136 or by some other means. In an alternate embodiment, core 136 is covered with an insulating material. The conductors 138 and 140 are each made of strips of the conductive material as in the inductor 50.

Figure 6A:
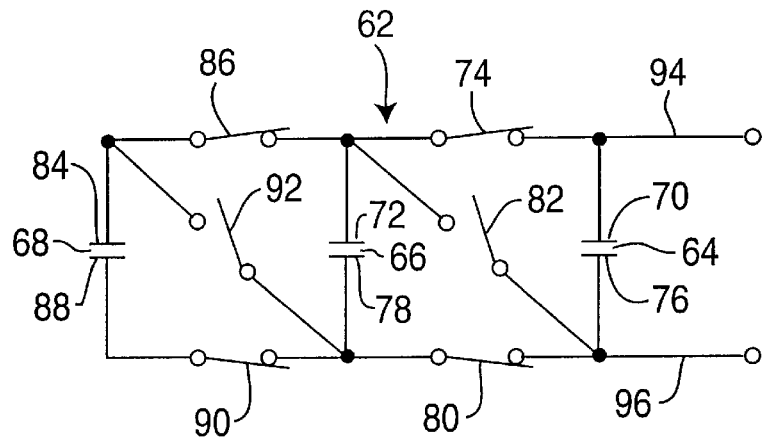
FIGS. 6a and 6b are circuit diagrams of a switched capacitor transformer which can be used in the power supply integrated electronic module of the present invention.
Figure 6B:
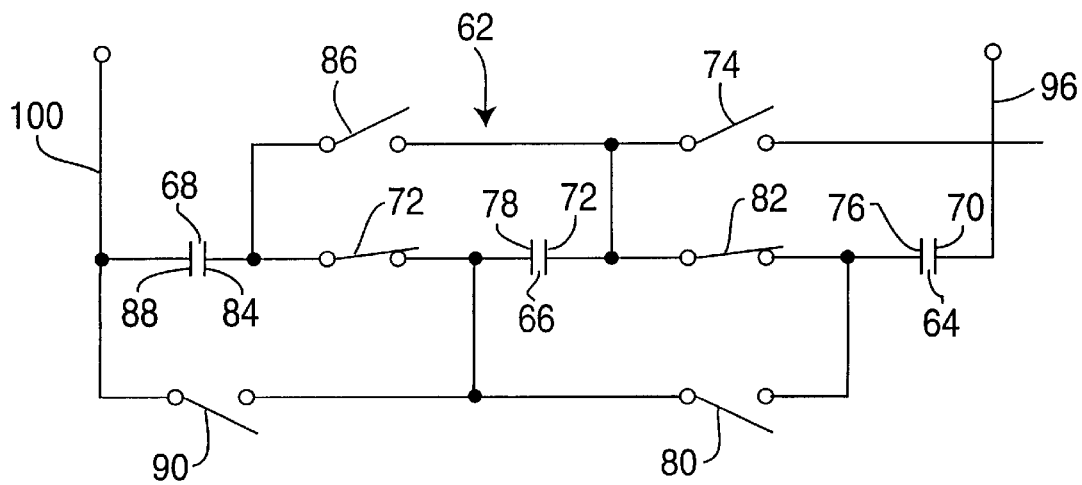

Referring now to FIGS. 6a and 6b, there is shown a circuit diagram of switched capacitor circuit 62 which can be switched between low-voltage and high-voltage state. The circuit 62 comprises three capacitors 64, 66 and 68. A first plate 70 of capacitor 64 is electrically connected to a first plate 72 of capacitor 66 through a switch 74. The second plate 76 of capacitor 64 is electrically connected to the second plate 78 of capacitor 66 through a switch 80. The second plate 76 of the capacitor 64 is also electrically connected to the first plate 72 of the capacitor 66 through a switch 82. The first plate 72 of the capacitor 66 is electrically connected to a first plate 84 of the capacitor 68 through a switch 86, and the second plate 78 of the capacitor 66 is electrically connected to the second plate 88 of the capacitor 68 through a switch 90. The second plate 78 of the capacitor 68 is also connected to the first plate 84 of the capacitor 68 through a switch 92.

When the switches 82 and 92 are open and the switches 74, 80, 86 and 90 are closed, as shown in FIG. 6a, the capacitors 64, 66 and 68 are electrically connected in parallel between terminals 94 and 96 connected to the plates 70 and 76 of the capacitor 64. This provides a low voltage state. However, when the switches 82 and 92 are closed, and the switches 74, 80, 86 and 90 are open, as shown in FIG. 6b, the capacitors 64, 66 and 68 are electrically connected in series to form a high voltage state between terminals 96 and 100 connected to the capacitors 64 and 68 respectively.

The transformer circuit 62 can be formed in the integrated electronic module 10 by forming the capacitors 64, 66 and 68 of conductive areas on the layers 20 of the body 18. The conductive areas may be on opposite sides of a layer 20 with the insulating layer 20 providing the dielectric of the capacitors, or may be formed in spaced relation on the same surface of a layer 20. The switches may be transistors, such as MOS transistors. The transistor switches may be discrete elements mounted on the body 20 or may be part of a standard silicon IC which is mounted on the body 18. The transistor switches may be connected to the capacitors through interconnects and vias to form the transformer circuit 62.

Thus, there is provided by the present invention an integrated electronic module which can include various electronic components, such as capacitors, resistors and inductors formed as areas of a conductive or resistance material coated on the surfaces of various layers of a dielectric material with the layers being bonded together to form a body which is bonded to a substrate of a fairly rigid and thermally conductive material. At least one transformer can be formed on, in or mounted on the body. Also, active electronic components, such as diodes and transistors, either as discrete elements or as part of a silicon integrated circuit, can be mounted on the body. The various electronic components are electrically connected by interconnects of a conductive material on the various layers and by vias of a conductive material extending through the layers to form a power supply circuit. By having the body of the integrated electronic module formed of a dielectric material, such as a glass or ceramic, the body not only can serve as the dielectric for various electronic circuits, but also provides good insulation between the various electronic components and can withstand the heat generated by a power supply circuit. In addition, the substrate not only supports the body with rigidity, but also serves as a good heat sink for conducting the heat generated by the power supply circuit away from the device. Thus, the integrated electronic module of the present invention is capable of forming a power supply circuit which is not readily possible with an integrated circuit formed in a substrate of a semiconductor material, such as silicon.

What is claimed is:

1. A power supply integrated electronic module comprising:
    a metal substrate having a surface;
    a body of a dielectric material mounted on and bonded to the surface of the substrate, said body being formed of a plurality of layers of the dielectric material bonded together;
    conductive material on the surface of at least one of said layers of the body and between two of said layers forming at least one capacitor and/or resistor;
    a transformer on at least one of said layers of the body; and
    means electrically connecting the capacitor and/or resistor and transformer into a power supply circuit.

2. The power supply integrated electronic module of claim 1 in which the means connecting the at least one capacitor and/or resistor and the transformer includes interconnects of a conductive material on the surface of at least one of said layers of the body.

3. The power supply integrated electronic module of claim 1 in which the means connecting the at least one capacitor and/or resistor and the transformer further comprises vias of a conductive material extending through said layers of the body.

4. The power supply integrated electronic module of claim 1, wherein the conductive material forms capacitors, in which at least some of the capacitors are formed by areas of a conductive material on opposite sides of a layer of the body with the layer forming the dielectric of the capacitor.

5. The power supply integrated electronic module of claim 1, further comprising discrete electronic components, such as diodes and transistors, mounted on the surface of the body and electrically connected to the at least one capacitor or resistor and the transformer to form the power supply circuit.

6. The power supply integrated electronic module of claim 1, in which the transformer comprises a core of a magnetic material and a conductive material extending in a spiral path around and along the core.

7. The power supply integrated electronic module of claim 6 in which there are two sets of spaced conductive strips extending in a spiral path around and along the core.

8. The power supply integrated electronic module of claim 7 in which the core extends in a closed path and the conductive strips are around separate portions of the core.

9. The power supply integrated electronic module of claim 6 in which an elongated groove is in at least one of said layers of the body, a first set of a plurality of spaced, parallel conductive strips are coated on the surface of the groove, the core of the transformer is in the groove and over the first set of conductive strips, and a second set of spaced, parallel conductive strips extend over the core and are electrically connected to the first set of conductive strips to form a conductor extending spirally around and along the core.

10. The power supply integrated electronic module of claim 9 in which the core is a layer of a magnetic material coated on the surface of the groove in the layer and over the first set of conductive strips.

11. The power supply integrated electronic module of claim 1, wherein the transformer comprises a plurality of capacitors electrically connected together through switches.

12. The power supply integrated electronic module of claim 11 in which the capacitors comprise sections of conductive material in a spaced apart relation on the surface of the layer of the body.

13. The power supply integrated electronic module of claim 11 in which the switches are transistors mounted on the body and electrically connected to the capacitors.

* * * * *